United States Patent
Chen et al.

(10) Patent No.: US 9,691,883 B2
(45) Date of Patent: Jun. 27, 2017

(54) ASYMMETRIC FORMATION APPROACH FOR A FLOATING GATE OF A SPLIT GATE FLASH MEMORY STRUCTURE

(71) Applicant: Taiwan Semiconductor Manufacturing Co., Ltd., Hsin-Chu (TW)

(72) Inventors: Sheng-Chieh Chen, Taichung (TW); Yuan-Tai Tseng, Zhubei (TW); Chang-Ming Wu, New Taipei (TW); Shih-Chang Liu, Alian Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 42 days.

(21) Appl. No.: 14/308,872

(22) Filed: Jun. 19, 2014

(65) Prior Publication Data

US 2015/0372121 A1    Dec. 24, 2015

(51) Int. Cl.
*H01L 29/788* (2006.01)
*H01L 29/66* (2006.01)
(Continued)

(52) U.S. Cl.
CPC .. *H01L 29/66825* (2013.01); *H01L 21/28273* (2013.01); *H01L 29/42328* (2013.01); (Continued)

(58) Field of Classification Search
CPC ............ H01L 29/792; H01L 29/66825; H01L 29/42344; H01L 29/66833; H01L 29/42328; H01L 29/42332; H01L 29/42324; H01L 29/4234; H01L 29/788; H01L 29/6656; H01L 29/7831; H01L 29/401; H01L 21/28282; H01L 21/28273;
(Continued)

(56) References Cited

U.S. PATENT DOCUMENTS 5,856,223 A * 1/1999 Wang ................ H01L 27/11521
                                                   257/E21.682
6,043,530 A * 3/2000 Chang ................ G11C 16/0416
                                                   257/316

(Continued)

*Primary Examiner* — Brett Feeney
*Assistant Examiner* — Sophia Nguyen
(74) *Attorney, Agent, or Firm* — Eschweiler & Potashnik, LLC

(57) ABSTRACT

A semiconductor structure of a split gate flash memory cell is provided. The semiconductor structure includes a semiconductor substrate having a source region and a drain region. Further, the semiconductor structure includes a floating gate, a word line, and an erase gate spaced over the semiconductor substrate between the source and drain regions with the floating gate arranged between the word line and the erase gate. The semiconductor structure further includes a first dielectric sidewall region disposed between the word line and the floating gate, as well as a second dielectric sidewall region disposed between the erase and floating gates. A thickness of the first dielectric sidewall region is greater than a thickness of the second dielectric sidewall region. A method of manufacturing the semiconductor structure and an integrated circuit including the semiconductor structure are also provided.

20 Claims, 8 Drawing Sheets

(51) Int. Cl.
*H01L 29/49* (2006.01)
*H01L 21/28* (2006.01)
*H01L 29/423* (2006.01)

(52) U.S. Cl.
CPC ...... *H01L 29/4983* (2013.01); *H01L 29/6656* (2013.01); *H01L 29/7883* (2013.01)

(58) Field of Classification Search
CPC ........... H01L 21/8239; H01L 27/11524; H01L 27/11546; H01L 27/11517; H01L 29/4893; H01L 29/7883; H01L 29/7881; H01L 29/42368; H01L 29/513; H01L 29/66484; H01L 27/11529; H01L 27/1156; H01L 27/1157; H01L 27/1052; H01L 21/823468; G11C 16/0416; G11C 16/0425; G11C 16/0408; G11C 16/0433; G11C 16/08; G11C 2213/71; G11C 29/82
See application file for complete search history.

(56) References Cited

U.S. PATENT DOCUMENTS

| | | | |
|---|---|---|---|
| 6,200,858 B1* | 3/2001 | Kokubu | H01L 21/28273 257/E21.209 |
| 6,291,297 B1* | 9/2001 | Chen | G11C 16/0433 257/E21.209 |
| 6,747,310 B2* | 6/2004 | Fan | H01L 27/11521 257/316 |
| 7,397,093 B2* | 7/2008 | Sel | H01L 21/28273 257/368 |
| 7,459,742 B2* | 12/2008 | Hwang | H01L 27/105 257/296 |
| 7,928,499 B2* | 4/2011 | Liu | H01L 21/28273 257/321 |
| 8,334,560 B2* | 12/2012 | Pan | H01L 21/28273 257/315 |
| 8,551,873 B2* | 10/2013 | Onuki | H01L 21/28247 257/E21.19 |
| 8,669,607 B1* | 3/2014 | Tsair | H01L 29/7881 257/316 |
| 2003/0067032 A1* | 4/2003 | Caprara | H01L 27/115 257/324 |
| 2004/0065917 A1* | 4/2004 | Fan | H01L 27/11521 257/315 |
| 2004/0077144 A1* | 4/2004 | Hsieh | H01L 27/11521 438/257 |
| 2004/0262665 A1* | 12/2004 | Iwata | G11C 11/22 257/314 |
| 2005/0189606 A1* | 9/2005 | Nakagawa | H01L 27/115 257/500 |
| 2006/0060913 A1* | 3/2006 | Ozawa | H01L 21/28273 257/317 |
| 2006/0273378 A1* | 12/2006 | Gao | G11C 16/0483 257/326 |
| 2007/0034938 A1* | 2/2007 | Kang | H01L 27/115 257/316 |
| 2007/0218633 A1* | 9/2007 | Prinz | B82Y 10/00 438/267 |
| 2008/0042183 A1* | 2/2008 | Mokhlesi | H01L 21/28273 257/314 |
| 2008/0049517 A1* | 2/2008 | Hung | G11C 16/0433 365/185.28 |
| 2008/0123416 A1* | 5/2008 | Chih | G11C 16/0433 365/185.05 |
| 2008/0157165 A1* | 7/2008 | Park | H01L 21/28273 257/316 |
| 2008/0248620 A1* | 10/2008 | Liu | H01L 21/28273 438/257 |
| 2009/0008696 A1* | 1/2009 | Yang | H01L 21/28273 257/315 |
| 2009/0039410 A1* | 2/2009 | Liu | H01L 21/28273 257/320 |
| 2009/0108328 A1* | 4/2009 | Widjaja | H01L 27/115 257/320 |
| 2011/0006355 A1* | 1/2011 | Shen | H01L 27/11521 257/316 |
| 2011/0070726 A1* | 3/2011 | Dickenscheid | H01L 21/28273 438/591 |
| 2011/0141806 A1* | 6/2011 | Kim | G11C 16/0441 365/185.2 |
| 2011/0244640 A1* | 10/2011 | Lin | H01L 21/28273 438/261 |
| 2013/0026552 A1* | 1/2013 | Toh | H01L 21/28273 257/316 |
| 2013/0313626 A1* | 11/2013 | Huang | H01L 29/42328 257/321 |
| 2014/0054667 A1* | 2/2014 | Tkachev | H01L 21/28273 257/315 |
| 2014/0091382 A1* | 4/2014 | Tadayoni | H01L 21/28273 257/320 |
| 2014/0126299 A1* | 5/2014 | Fukumoto | G11C 16/0416 365/185.33 |
| 2014/0307510 A1* | 10/2014 | Lin | H01L 29/94 365/185.18 |
| 2015/0008451 A1* | 1/2015 | Su | H01L 21/823425 257/77 |
| 2015/0014761 A1* | 1/2015 | Hsu | H01L 21/28273 257/316 |
| 2015/0035040 A1* | 2/2015 | Yoo | H01L 29/7881 257/320 |
| 2015/0137207 A1* | 5/2015 | Chuang | H01L 29/49 257/316 |
| 2015/0194519 A1* | 7/2015 | Wada | H01L 29/66825 257/315 |
| 2015/0270273 A1* | 9/2015 | Ma | H01L 27/11548 257/316 |
| 2015/0280004 A1* | 10/2015 | Wu | H01L 29/66825 257/321 |
| 2015/0295056 A1* | 10/2015 | Zhang | H01L 29/42328 438/258 |
| 2015/0333082 A1* | 11/2015 | Chuang | H01L 29/792 257/326 |
| 2015/0364558 A1* | 12/2015 | Wu | H01L 29/42368 257/316 |
| 2015/0380568 A1* | 12/2015 | Tseng | H01L 29/792 257/326 |
| 2016/0013195 A1* | 1/2016 | Tsao | H01L 29/42328 257/316 |
| 2016/0013197 A1* | 1/2016 | Liu | H01L 27/1157 257/322 |
| 2016/0035576 A1* | 2/2016 | Bell | H01L 21/28273 257/326 |
| 2016/0087056 A1* | 3/2016 | Wu | H01L 29/42328 257/320 |

* cited by examiner

ASYMMETRIC FORMATION APPROACH FOR A FLOATING GATE OF A SPLIT GATE FLASH MEMORY STRUCTURE

BACKGROUND

Flash memory is an electronic non-volatile computer storage medium that can be electrically erased and reprogrammed. It is used in a wide variety of commercial and military electronic devices and equipment. To store information, flash memory includes an addressable array of memory cells, typically made from floating gate transistors. Common types of flash memory cells include stacked gate memory cells and split gate flash memory cells (e.g., the third generation SUPERFLASH (ESF3) memory cell). Split gate flash memory cells have several advantages over stacked gate memory cells, such as lower power consumption, higher injection efficiency, less susceptibility to short channel effects, and over erase immunity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
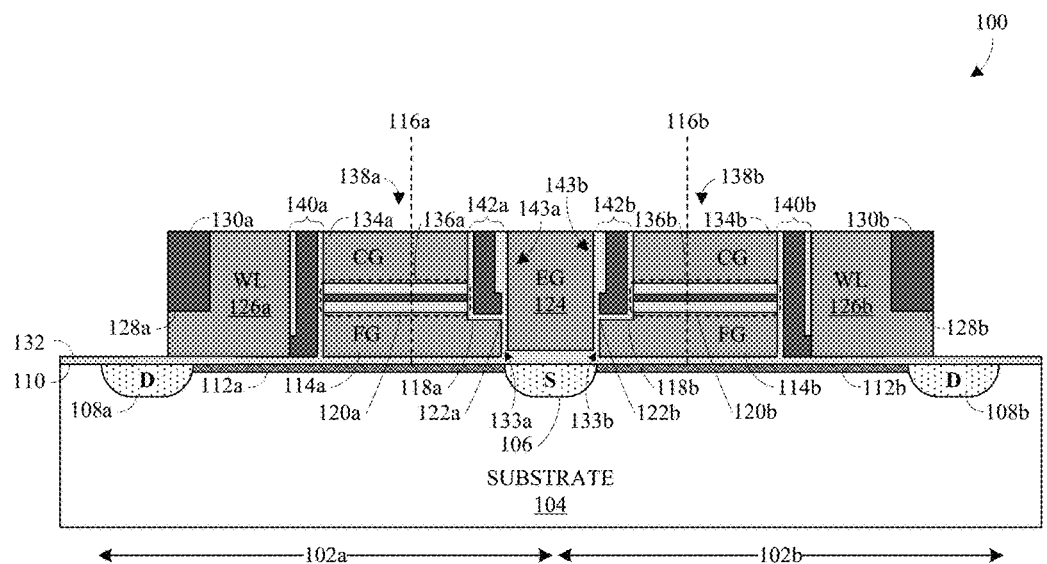
FIG. 1 illustrates a cross-sectional view of a semiconductor structure for a pair of split gate flash memory cells that utilizes an asymmetric floating gate profile.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Split gate flash memory cells are semiconductor devices, typically formed as part of integrated circuits. Recently, split gate flash memory cells have received great attention due to the development of high memory capacities (relative to other types of flash memory cells). However, with this increased capacity, it has proven difficult to simultaneously achieve lower leakage current between floating gates and word lines of flash gate memory cells, and higher erase speed.

One of the reasons for the foregoing challenges is that conventional split-gate memory cells utilize a symmetrical floating gate profile, in which symmetrical dielectric regions having equal thicknesses are arranged on opposing sidewalls of the memory cells' floating gates. More specifically, these dielectric regions electrically isolate one end of the floating gate from a conductive word line and isolate the other end of the floating gate from a conductive erase gate. These dielectric regions have conventionally been limited to the same thickness because of the symmetrical floating gate profile and the approach to manufacturing the symmetrical floating gate. Hence, increasing the thickness of the dielectric region between the word line and the floating gate to reduce leakage current between the word line and the floating gate leads to a similar increase in the thickness of the dielectric region between the erase gate and the floating gate. This, in turn, reduces the erase speed since the tunneling between the floating gate and the erase gate is hindered by the increased dielectric thickness. On the other hand, reducing the thickness of the dielectric region between the erase gate and the floating gate to increase the erase speed leads to a similar decrease in the thickness of the dielectric region between the word line and the floating gate. This, in turn, increases leakage current between the floating gate and the word line.

In view of the foregoing, the present disclosure is directed to a split gate flash memory cell employing an asymmetric floating gate profile. The asymmetric floating gate profile allows the thickness of the dielectric between the floating gate and the word line to be increased relative to the thickness of the dielectric between the floating gate and the erase gate. The increase in dielectric thickness between the floating gate and the word line reduces leakage current between the floating gate and the word line, while at the same time allowing a reduced dielectric thickness between the floating gate and the erase gate to increase erase speed. The reduction in leakage current further improves charge retention by the floating gate.

With reference to FIG. 1, a cross-sectional view of an improved semiconductor structure 100 for a pair of split gate flash memory cells 102a, 102b according to some embodiments is provided. The semiconductor structure 100 includes a semiconductor substrate 104. The semiconductor substrate 104 is n- or p-type, and can, for example, be a bulk silicon substrate or a silicon-on-insulator (SOI) substrate. If present, an SOI substrate is often made up of an active layer of high quality silicon in which the memory cells 102 are formed. In such instances, the memory cells 102 are arranged over a buried layer (BOX) of electrically insulating silicon dioxide, which is arranged over a bulk silicon support substrate. Typically, the semiconductor substrate 104 is planar with a uniform thickness.

The semiconductor substrate 104 includes a shared source/drain region 106 (shared by the split gate flash memory cells 102) and two individual source/drain regions 108*a*, 108*b* (individual to the split gate flash memory cells 102). The shared and individual source/drain regions 106, 108 are of the same type (i.e., n- or p-type) and of the opposite type as the semiconductor substrate 104. Alternatively, the shared and individual source/drain regions 106, 108 are of opposite type as a well region or active region in which the split gate flash memory cells 102 are formed. Further, the shared and individual source/drain regions 106, 108 are embedded within a top surface 110, typically a planar surface, of the semiconductor substrate 104 (e.g., by doping) and are spaced to define a channel region 112*a*, 112*b* between each individual source/drain region 108 and the shared source/drain region 106. The channel regions 112 correspond to the different split gate flash memory cells 102 of the pair.

Over each channel region 112 (i.e., for each split gate flash memory cell 102), the semiconductor structure 100 includes a floating gate 114*a*, 114*b*. The floating gate 114 is asymmetrical about an axis 116*a*, 116*b* running perpendicular to the surface 110 and is recessed proximate to the shared source/drain region 106 to define a floating gate ledge 118*a*, 118*b*. The floating gate ledge 118 exhibits a reduced height relative to a top surface 120*a*, 120*b* of the floating gate 114 and runs along a floating gate edge 122*a*, 122*b* facing the shared source/drain region 106. In this way, the floating gate 114 has an asymmetrical, stepped appearance when viewed in profile. Over the shared source/drain region 106 and spaced between the floating gates 114, the semiconductor structure 100 includes an erase gate 124 shared by the split gate flash memory cells 102 of the pair. Further, adjacent to or partially over each individual source/drain region 108, and spaced between the individual source/drain region 108 and the floating gate 114, the semiconductor structure 100 includes a word line 126*a*, 126*b*. Similar to the floating gate 114, the word line 126 includes a word line ledge 128*a*, 128*b* upon which a dielectric 130*a*, 130*b*, such as silicon nitride, rests.

Disposed between the semiconductor substrate 104 and the floating and erase gates 114, 124, as well as between the semiconductor substrate 104 and the word lines 126, the semiconductor structure 100 includes a base dielectric region 132, such as silicon dioxide, to electrically isolate the floating and erase gates 114, 124, as well as the word lines 126, from the semiconductor substrate 104. The base dielectric region 132 further includes or is otherwise associated with first dielectric extensions 133*a*, 133*b* extending vertically up to the floating gate ledges 118 of the floating gates 114 to fill voids between the floating gates 114 and the erase gate 124. The first dielectric extensions 133 electrically isolate the floating gates 114 from the erase gate 124 and, in some embodiments, are formed of silicon dioxide. Typically, the thickness of the first dielectric extensions 133 between the floating gates 114 and the erase gate 124 is less than 20 Angstroms (A). The less the thickness, the faster the split gate flash memory cells 102 can be erased.

Over the top surface 120 of each floating gate 114, the semiconductor structure 100 includes a control gate 134*a*, 134*b* and an inter-gate dielectric region 136*a*, 136*b*. The inter-gate dielectric region 136 is interposed between the control gate 134 and the floating gate 114 to electrically isolate the floating gate 114 from the control gate 134. The inter-gate dielectric region 136 is typically an oxide-nitride-oxide (ONO) dielectric, as illustrated, but other types of dielectrics can be used in place of the ONO dielectric. For readability, the individual layers of the ONO dielectric are not labeled, but it is to be understood that the ONO dielectric includes a nitride layer sandwiched between two oxide layers in the vertical direction.

Each floating gate 114, its corresponding control gate 134, and its corresponding inter-gate dielectric region 136 form a stack 138*a*, 138*b*. Each stack 138 corresponds to a different split gate flash memory cell 102 of the pair. Filling the void between the stack 138 and the word line 126, as well as the void between the stack 138 and the erase gate 124, the semiconductor structure 100 includes a first dielectric sidewall region 140*a*, 140*b* and a second dielectric sidewall region 142*a*, 142*b*, respectively, running vertically along opposing sides of the stack 138.

The first dielectric sidewall region 140 is disposed between the stack 138 and the word line 126 to electrically isolate the stack 138 from the word line 126, and the second dielectric sidewall region 142 is disposed between the stack 138 and the erase gate 124 to electrically isolate the stack 138 from the erase gate 124. The first and second dielectric sidewall regions 140, 142 also serve as spacers between the stack 138, the erase gate 124 and the word line 126. Typically, the first dielectric sidewall region 140 is, or otherwise includes, an ONO dielectric. Further, the second dielectric sidewall region 142 typically includes the corresponding first dielectric extension 133 of the base dielectric region 132, as well as a second dielectric extension 143*a*, 143*b* extending vertically up from the floating gate ledge 118 of the corresponding floating gate 114. The second dielectric extension 143 is typically an ONO dielectric. Other types of dielectrics can alternatively be used in place of the ONO dielectrics of the first and second dielectric sidewall regions 140, 142. Typically, the first dielectric sidewall region 140 and the second dielectric extension 143 of the second dielectric sidewall region 142 have a thickness of more than 100 A.

Advantageously, the asymmetric profile of the floating gates 114 allows the thickness of the first dielectric sidewall regions 140 between the floating gates 114 and the word lines 126 to be increased relative to the thickness of the second dielectric sidewall regions 142 (more specifically, the thickness of the first dielectric extensions 133) between the floating gates 114 and the erase gate 124. The increase in dielectric thickness between the floating gates 114 and the word lines 126 reduces leakage current between the floating gates 114 and the word lines 126, while at the same time allowing a reduced dielectric thickness between the floating gates 114 and the erase gate 124 to increase erase speed. The reduction in leakage current further improves charge retention by the floating gates 114.

In operation, the floating gates 114 of the split gate flash memory cells 102 store different amounts charge (e.g., electrons). The charge is advantageously stored in a non-volatile manner so that the stored charge persists in the absence of power. For example, an electronic device including the split gate flash memory cells 102 does not require power for data stored in the split gate flash memory cells 102 to persist. The amount of charge stored represents the difference between a binary "1" and a binary "0" and is varied through program (i.e., write), read, and erase operations. These operations are performed through selective biasing of the erase and control gates 124, 134, as well as through selective biasing of the word lines 126.

During a program operation on one of the split gate flash memory cells 102, a voltage is applied across the shared and individual source/drain regions 106, 108 of the split gate flash memory cell 102. This voltage is typically applied so as to promote the migration of charge from the individual source/drain region 108 to the shared source/drain region 106 when the channel region 112 is in a conductive state. Further, a voltage is applied to the erase gate 124. Typically, the voltage is the same voltage applied to the shared source/drain region 106 so as to prevent the migration of charge between the erase gate 124 and the shared source/drain region 106. Even more, a voltage is applied to the word line 126 to induce part of the channel region 112 to conduct. More specifically, application of a voltage to the word line 126 attracts carriers to part of the channel region 112 adjacent to the word line 126. The voltage applied to the word line 126 is typically less than the voltage applied to the shared source/drain region 106.

To complete the program operation, a voltage is applied to the control gate 134. Typically this voltage is high relative to the voltage applied to the word line 126 and the erase gate 124, as well as the voltage applied across the shared and individual source/drain regions 106, 108. Application the voltage to the control gate 134 induces the remaining part of the channel region 112 to conduct through attraction of carriers. This, in turn, allows electric current to flow between the shared and individual source/drain regions 106, 108 (e.g., electrons flow from the individual source/drain region 108 to the shared source/drain region 106). Further, application of the voltage to the control gate 134 further promotes some of the carriers (e.g., electrons) from the channel region 112 to tunnel through the base dielectric region 132 to the floating gate 114. The carriers are consequently stored within the floating gate 114 in a non-volatile manner.

The charge resulting from the stored carriers screen an electric field formed between the control gate 134 and the channel region 112 when the control gate 134 is biased. This has an effect of increasing the threshold voltage $V_{th}$ of the split gate flash memory cell 102 by an amount $\Delta V_{th}$ that is proportional to the thickness of the base dielectric region 132 between the floating gate 114 and the channel region 112. The threshold voltage increase $\Delta V_{th}$ provides the basis of a read operation on the split gate flash memory cell 102. By applying a voltage $V_{CG}$ to the control gate 134 that is greater than $V_{th}$, but less than $V_{th}+\Delta V_{th}$, the stored state within the split gate flash memory cell 102 can be sensed. If the split gate flash memory cell 102 turns on (i.e., allows charge to flow) during application of the voltage $V_{CG}$, then it stores a first data state (e.g., a logical "0"). If the split gate flash memory cell 102 does not turn on, then it stores a second data state (e.g., a logical "1").

More specifically, during a read operation on one of the split gate flash memory cells 102, a voltage is applied across the shared and individual source/drain regions 106, 108 of the split gate flash memory cell 102. Typically, this voltage is applied so as to promote the migration of charge from the shared source/drain region 106 to the individual source/drain region 108 when the channel region 112 is in a conductive state. Further, a voltage is applied to the erase gate 124. Typically, the voltage is the same voltage applied to the shared source/drain region 106 so as to prevent the migration of charge between the erase gate 124 and the shared source/drain region 106. Even more, a voltage is applied to the word line 126 to induce part of the channel region 112 to conduct. More specifically, application of a voltage to the word line 126 attracts carriers to part of the channel region 112 adjacent to the word line 126. The voltage applied to the word line 126 is typically less than the voltage applied to the shared source/drain region 106. To complete the read operation, the voltage $V_{CG}$ is applied to the control gate 134. This voltage is such that it falls between the threshold voltage and the threshold voltage increase $\Delta V_{th}$ (i.e., $V_{th}<V_{CG}<V_{th}+\Delta V_{th}$).

During an erase operation on one of the split gate flash memory cells 102, a common voltage is applied to the shared and individual source/drain regions 106, 108, as well as the control gate 134 and the word line 126. Even more, a voltage high relative to the common voltage is applied to the erase gate 124. This high voltage promotes charge stored in the floating gate 114 to tunnel through the first dielectric extension 133 to the erase gate 124. As a result of this tunneling, the charge is removed from the floating gate 114 and split gate flash memory cell 102 is erased.

In view of the foregoing, a program operation can, for example, be performed by applying +5 volts (V) and 0V to the shared and individual source/drain regions 106, 108, respectively, applying +1V to the word line 126, +11V to the control gate 134, and +5V to the erase gate 124. As another example, a read operation can be performed by applying 0V and +1V to the shared and individual source/drain regions 106, 108, respectively, applying +3V to the word line 126, +2V to the control gate 134, and 0V to the erase gate 124. As yet another example, an erase operation can be performed by applying 0V to the source and drain regions 106, 108, 0V to the word line 126, 0V to the control gate 126, and +13V to the erase gate 124.

Figure 2:
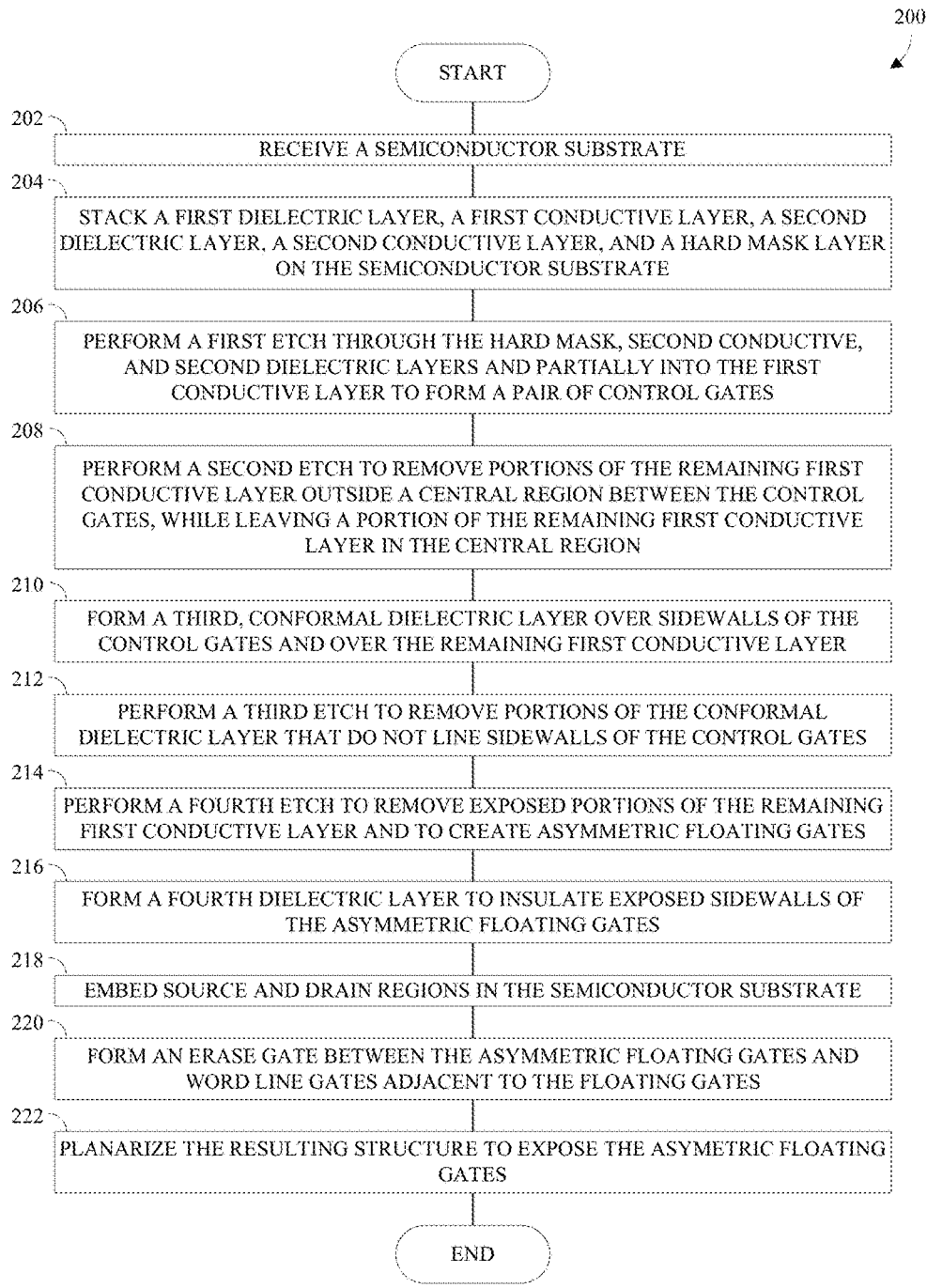
FIG. 2 illustrates a flow chart of a process of manufacturing a semiconductor structure for a pair of split gate flash memory cells that utilizes an asymmetric floating gate profile.

With reference to FIG. 2, a method 200 of manufacturing the semiconductor structure 100 according to some embodiments is provided. In some embodiments, the method 200 is performed as part of the manufacture of an integrated circuit for a flash memory including an array of split-gate flash memory cells. In describing the method 200, reference will be made to FIGS. 3A-M, which describe the semiconductor structure 100 at various stages of manufacture.

Figure 3A:
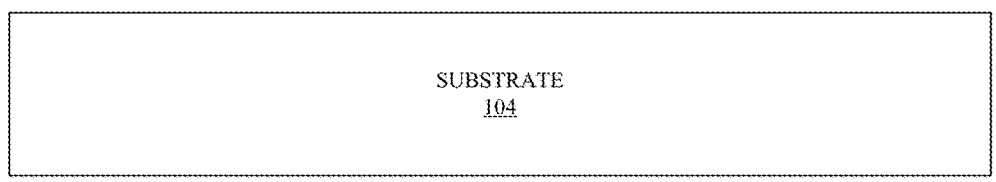
FIGS. 3A-M illustrate a series of cross-sectional views of a semiconductor structure at various stages of manufacture for a pair of split gate flash memory cells that utilizes an asymmetric floating gate profile.

As shown by FIG. 3A, a semiconductor substrate 104 is first received (Action 202). The semiconductor substrate 104 is typically planar with a uniform thickness. Further, the semiconductor substrate 104 is n- or p-type, and can, for example, be a handle wafer, such as a Si wafer or a silicon-on-insulator (SOI) substrate. If present, an SOI substrate is often made up of an active layer of high quality silicon in which the memory cells 102 are formed. In such instances, the memory cells 102 arranged over a buried layer (BOX) of electrically insulating silicon dioxide, which is arranged over a bulk silicon support substrate.

Figure 3B:
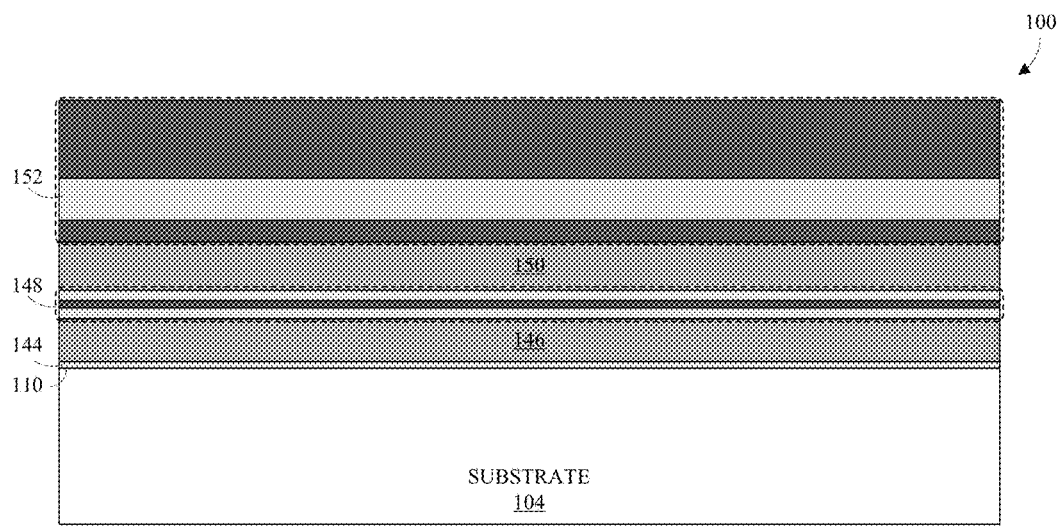

As shown by FIG. 3B, after receiving the semiconductor substrate 104, a first dielectric layer 144, a first conductive layer 146, a second dielectric layer 148, a second conductive layer 150, and a hard mask layer 152 are next stacked or formed (Action 204) in that order on a surface 110 of the semiconductor substrate 104. The layers 144, 146, 148, 150, 152 are typically deposited with a uniform thickness. Examples of the first dielectric layer 144 include silicon dioxide. Examples of the second dielectric layer 148 include an ONO film, as illustrated. Examples of the first and second conductive layers 146, 150 include polysilicon and metal. Examples of the hard mask layer 152 include a nitride oxide nitride (NON) film, as illustrated. For readability, the individual layers of the second dielectric layer 148 and the hard mask layer 152 are not labeled.

Figure 3C:
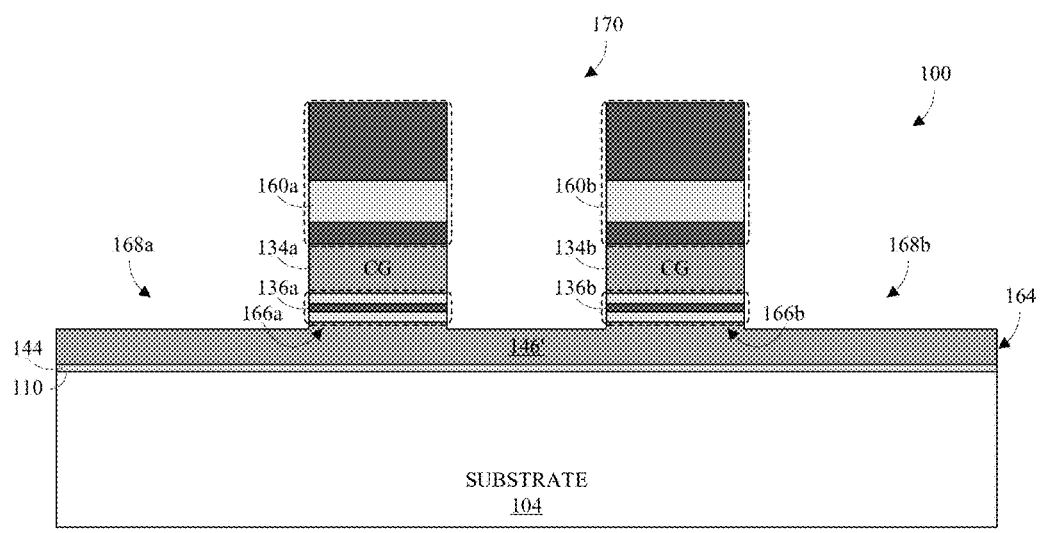

As shown by FIG. 3C, a first etch is next performed (Action 206) through the hard mask, second conductive, and second dielectric layers 148, 150, 152 and partially into the first conductive layer 146 to form a pair of spaced control gates 134a, 134b. In some instances, this etching is performed using photoresist. For example, a layer of photoresist can be deposited on the hard mask layer 152, typically with a uniform thickness. The photoresist layer is then patterned to create a mask masking control gate regions of the layers 144, 146, 148, 150, 152. With the mask generated, the semiconductor structure 100 is etched down to the first conductive layer 146 and the mask is removed.

The formed control gates 134 are each sandwiched between an inter-gate dielectric region 136a, 136b and a hard mask 160a, 160b, and each rest atop the remaining first conductive layer 146'. The inter-gate dielectric region 136 electrically isolates the remaining first conductive layer 146' from the control gates 134, while the hard mask 160 masks the control gates 134 during manufacture. The remaining first conductive layer 146' includes a base region 164 of uniform thickness and an elevated region 166a, 166b atop the base region 164 for each control gate 134 of the semiconductor structure 100. The elevated region 166 for a control gate 134 supports the control gate 134 and/or otherwise acts as a pedestal for the control gate 134.

As shown in FIGS. 3D-G, a second etch (Action 208) is subsequently performed to remove peripheral portions 168a, 168b of the remaining first conductive layer 146' outside a central region 170 between the control gates 134, while leaving a portion of the remaining first conductive layer 146' in the central region 170. In some embodiments, as illustrated by FIGS. 3D-G, this is performed using photoresist.

Figure 3D:
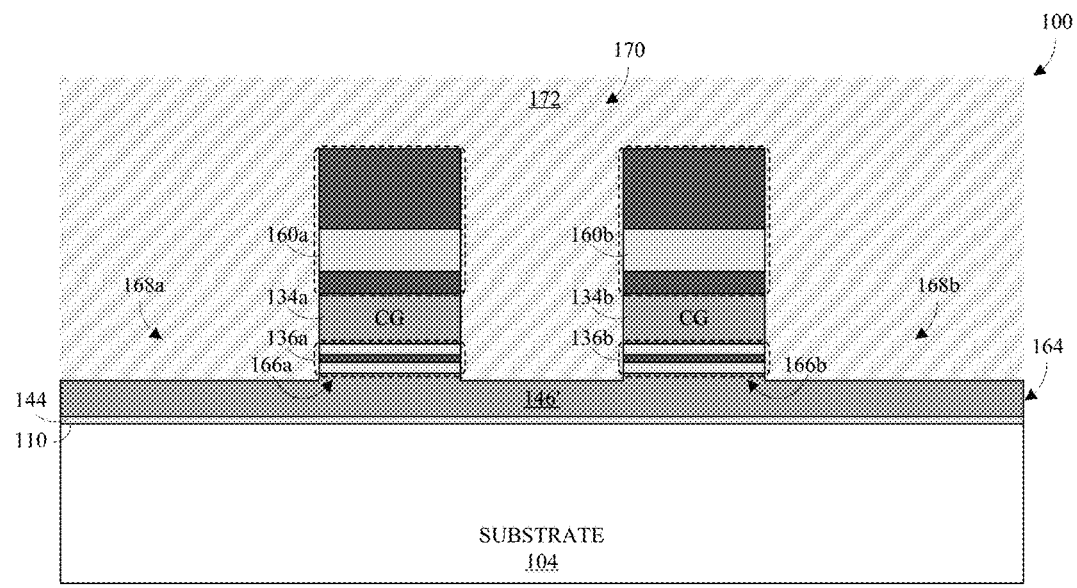
Figure 3E:
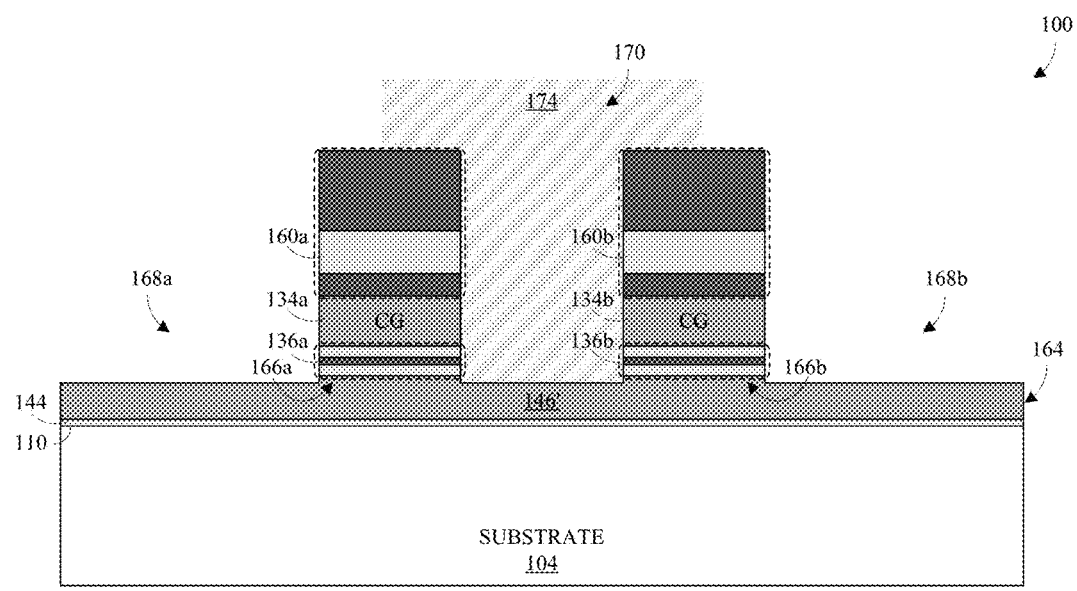
Figure 3F:
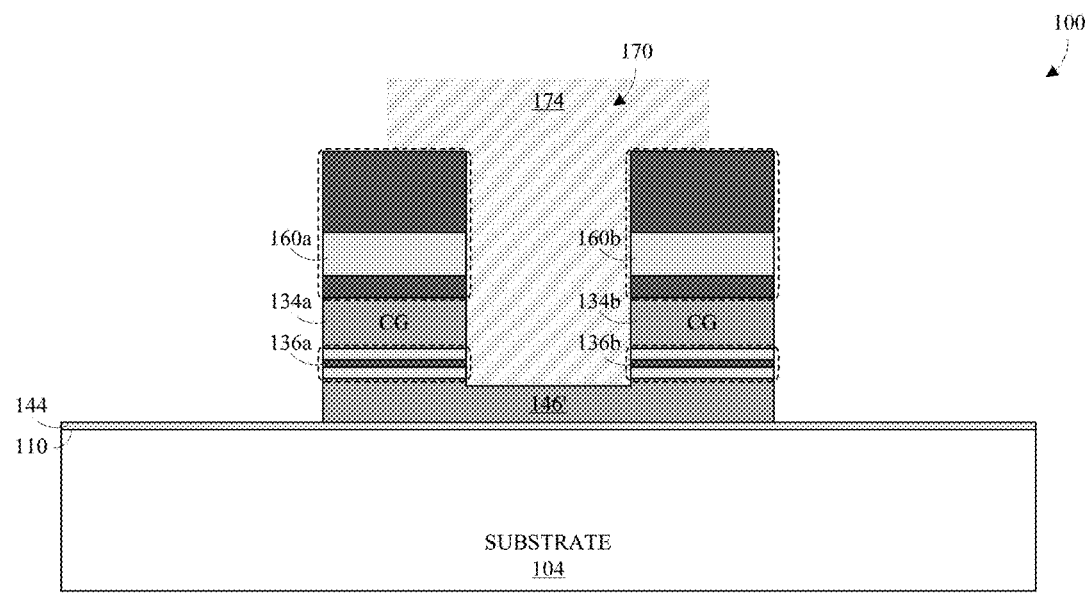
Figure 3G:
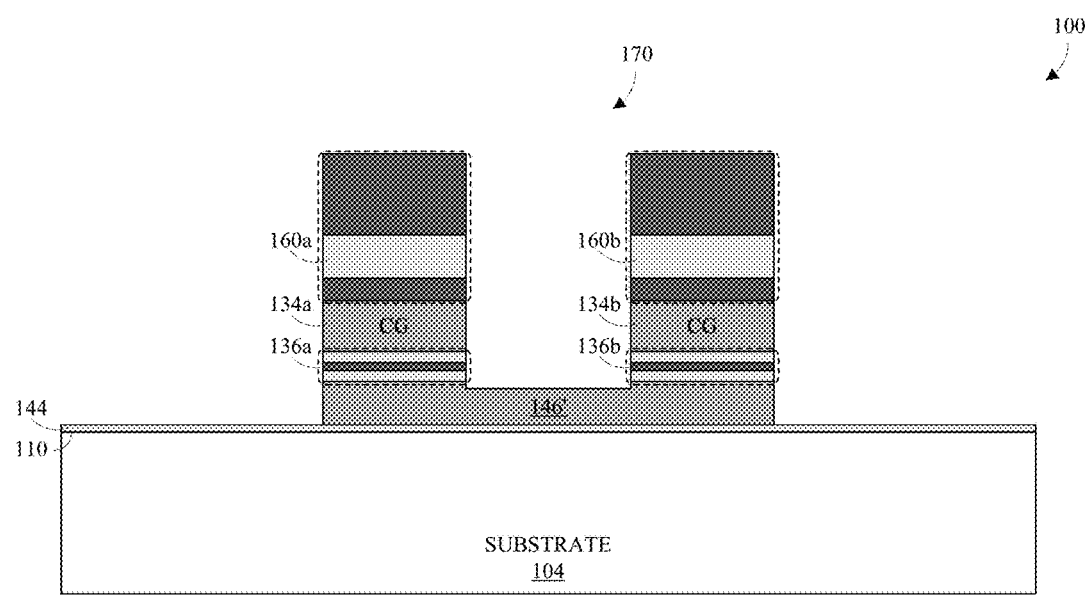

As shown in FIG. 3D, a photoresist layer 172 is deposited to cover the semiconductor structure 100 and to fill the central region 170 of the semiconductor structure 100. As shown in FIG. 3E, the photoresist layer 172 is then patterned to create a mask 174 masking the central region 170, while leaving the peripheral portions 168 of the remaining first conductive layer 146' exposed. For example, light can be passed through a mask to pattern the photoresist layer 172. As shown in FIG. 3F, with the mask 174 created, the semiconductor structure 100 is etched (e.g., dry etched) to remove the peripheral portions 168. Subsequently, as shown in FIG. 3G, the mask 174 is removed.

Figure 3H:
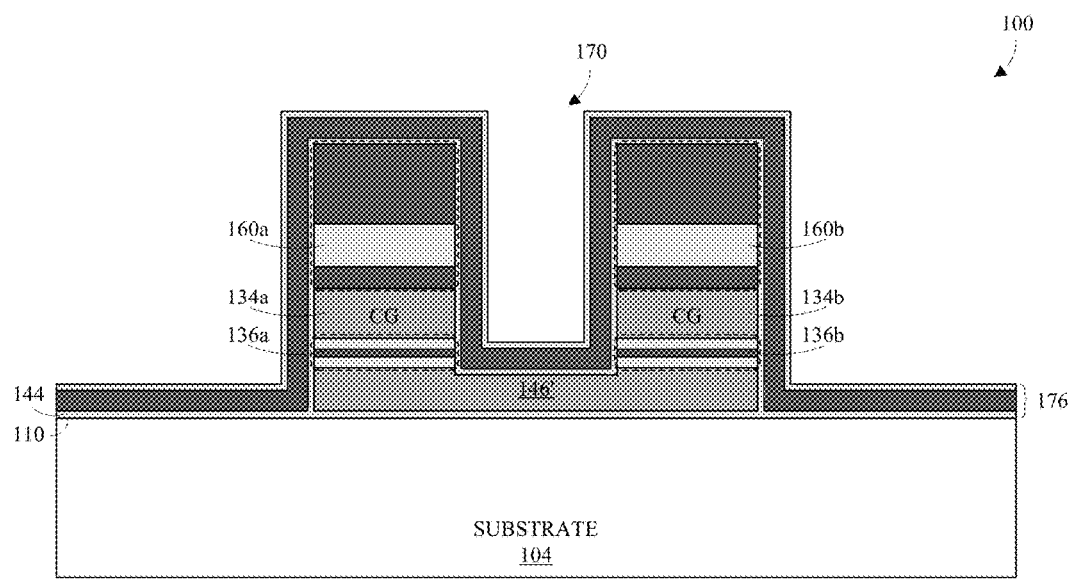

As shown in FIG. 3H, after removing the peripheral portions 168, a third dielectric layer 176 is conformally formed (Action 210) on the semiconductor structure 100 over sidewalls of the control gates 134 and over the remaining first conductive layer 146'. Typically the third dielectric layer 176 is an ONO dielectric, but other types of dielectrics can be used in place of the ONO dielectric.

Figure 3I:
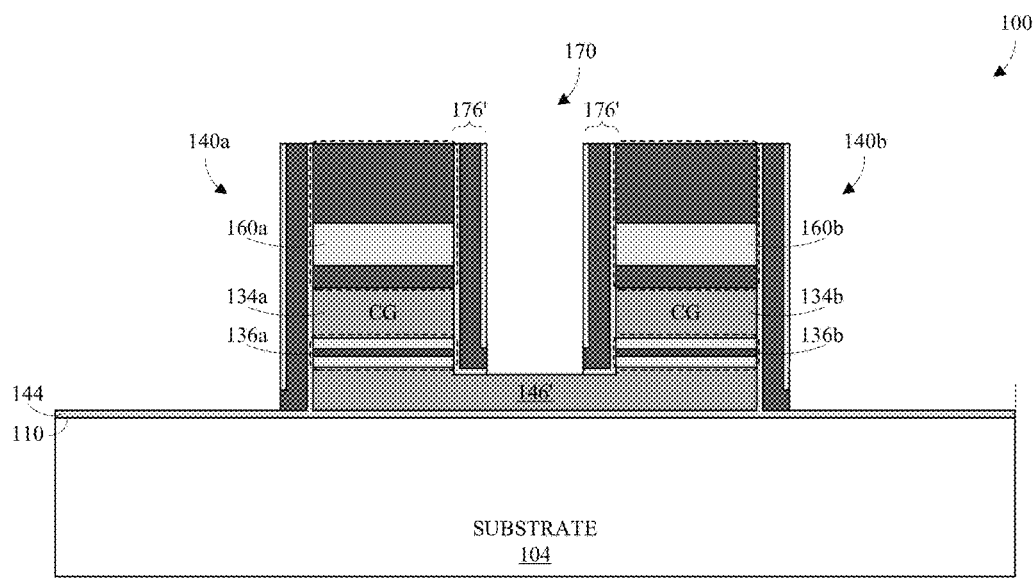

As shown in FIG. 3I, a third etch is next performed (Action 212) to remove portions of the third dielectric layer 176 that do not line sidewalls of the control gates 134. Typically this is performed by removing the approximate thickness of the third dielectric layer 176 anisotropically in the vertical direction. In other words, portions of the third dielectric layer 176 running in the horizontal direction are removed. The third etch yields first dielectric sidewall regions 140a, 140b running along the peripheral sides of the control gates 134.

Figure 3J:
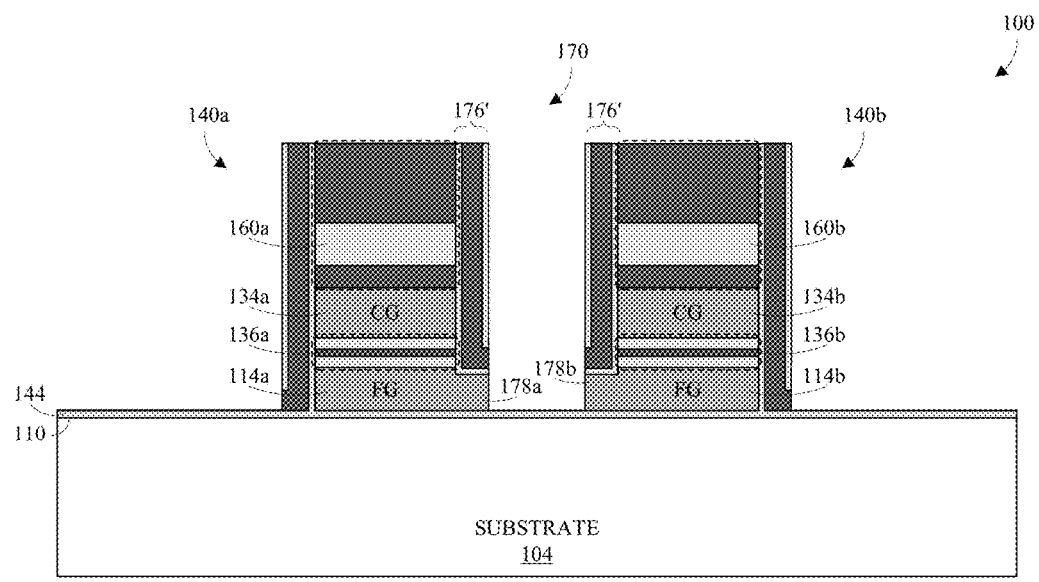

As shown in FIG. 3J, a fourth etch is performed (Action 214) to remove exposed portions of the remaining first conductive layer 146' in the central region 170 and to create a pair of floating gates 114a, 114b with an asymmetric profile.

Figure 3K:
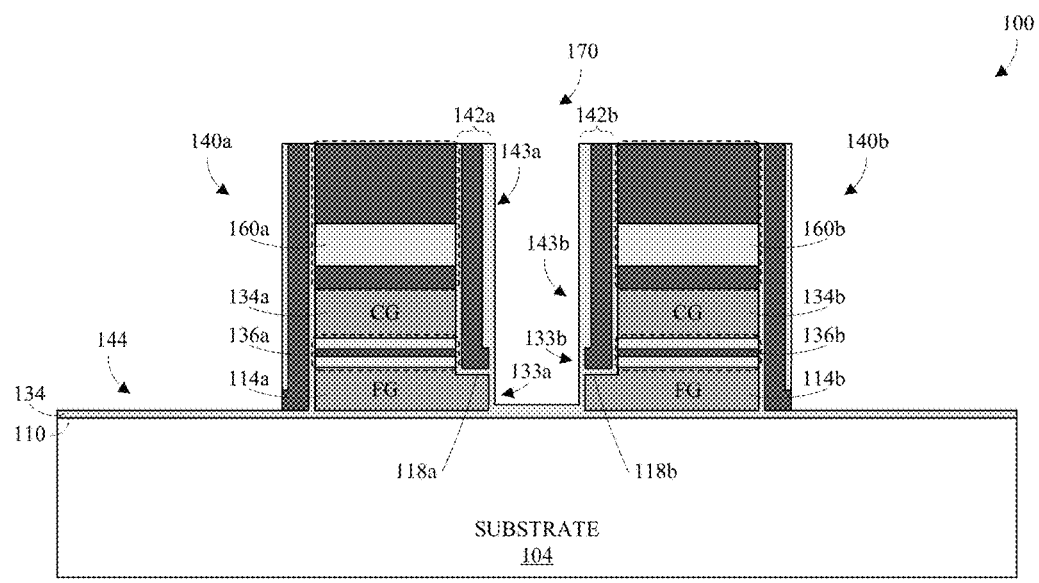

As shown in FIG. 3K, with the floating gates 114 formed, a fourth dielectric layer, such as silicon oxide, is formed (Action 216) within the central region 170 to insulate exposed sidewalls 178a, 178b (see FIG. 3J) of the asymmetric floating gates 114 and to pad the remaining third dielectric layer 176' in the central region 170 (see FIG. 3J). Typically the formation is performed by a high temperature oxide (HTO) deposition. For each control gate 114, the formation yields a first dielectric extension 133a, 133b associated with a base dielectric region 134 and extending vertically therefrom to a floating gate ledge 118a, 118b. The formation further yields a second dielectric sidewall region 142a, 142b for each control gate 114 that includes the corresponding first dielectric extension 133 and a second dielectric extension 143a, 143b running vertically up from the floating gate ledge 118 along a sidewall of control gate 134.

Figure 3L:
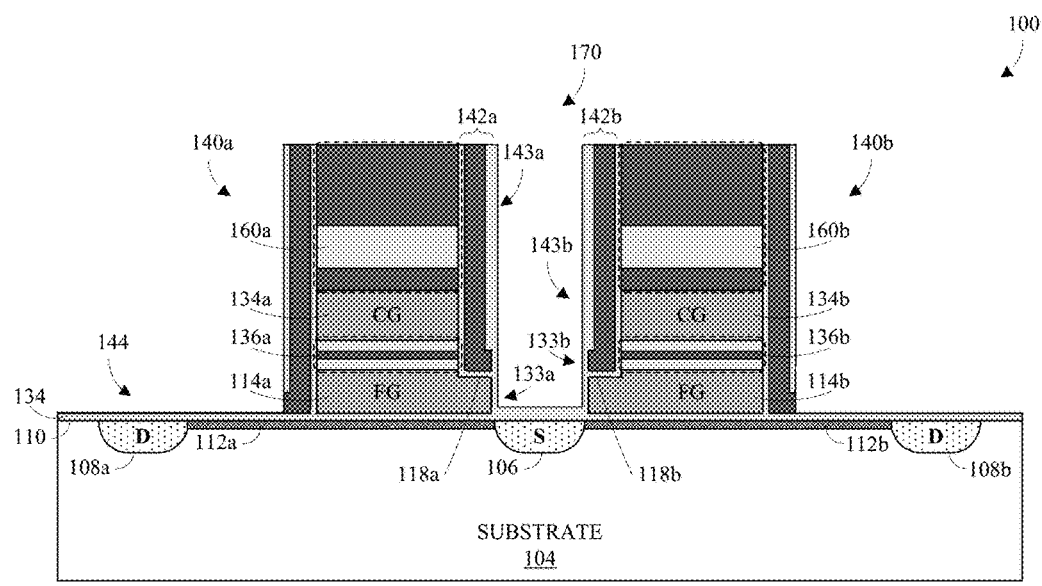

As shown in FIG. 3L, a shared source/drain region 106 (shared by the split gate flash memory cells 102) and two individual source/drain regions 108a, 108b (individual to the split gate flash memory cells 102) are next embedded (Action 218) within the surface 110 of the semiconductor substrate 104. In some embodiments, the embedding is performed by masking the peripheral regions of the semiconductor structure 100 (i.e., those regions outside the central region 170) with a photoresist. Thereafter, ions (e.g., n+ ions) are implanted into the semiconductor substrate 104 to form the shared source/drain region 106 with a predefined thickness, such as 20 Å. With the shared source/drain region 106 embedded, the photoresist is removed and the central region 170 is masked by with a photoresist. Thereafter, ions (e.g., n+ ions) of the same type as the shared source/drain region 106 are implanted into the semiconductor substrate 104 to form the two individual source/drain regions 108 with a predefined thickness, such as 20 Å. The shared and individual source/drain regions 106, 108 are spaced apart with the shared source/drain region 106 in the middle of the two individual source/drain regions 108. Each individual source/drain region 108 and the shared source/drain region 106 define a channel region 112a, 112b therebetween. The shared and individual source/drain regions 106, 108 are of the same type (i.e., p- or n-type) and of an opposite type as the semiconductor substrate 104.

Figure 3M:
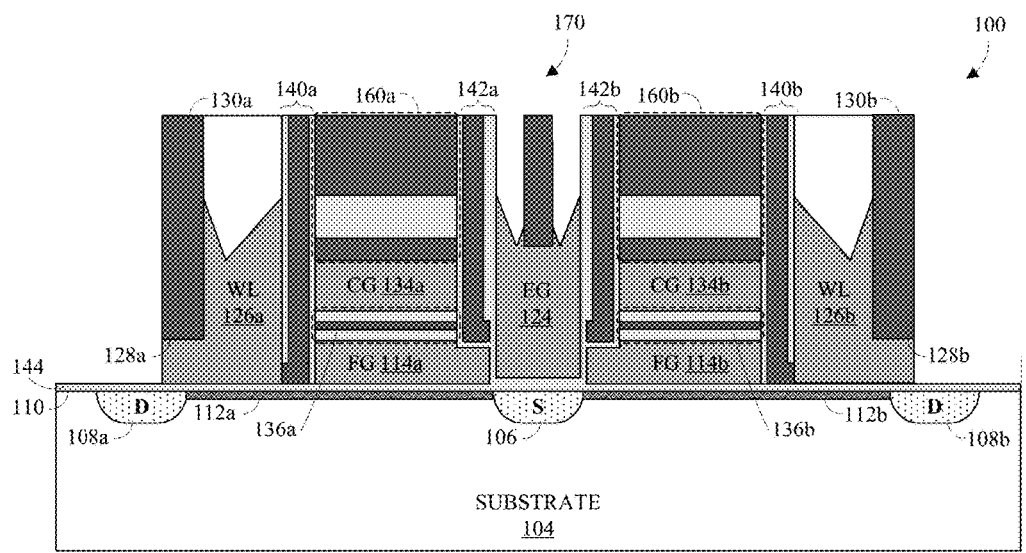

As shown in FIG. 3M, an erase gate 124 is formed (Action 220) in the central region 170 over the shared source/drain region 106, and word lines 126a, 126b are formed (Action 220) at the peripheral of the semiconductor structure 100 between the individual source/drain regions 108 and the floating gates 114. The specific approach by which the erase gate 124 and the word lines 126 are formed is beyond the scope of the present disclosure. However, in some embodiments, the erase gate 124 and the word lines 126 are formed by depositing a conductive material, such as polysilicone or metal, etching the conductive material to carve out word line ledges 128a, 128b for each world line 126, depositing a dielectric material, such as silicon dioxide, and etching the dielectric material to only rest upon the word line ledges 128.

With the erase gate 124 and the word lines 126 formed, the semiconductor structure 100 is planarized (Action 222) down to the control gates 134 to arrive at the semiconductor structure 100 as shown in FIG. 1. The planarization removes the hard mask 160, as well as portions of the first and second sidewall dielectric regions 140, 142, the word lines 126, and dielectrics 130a, 130b resting upon the ledges 128 of the word lines 126. The planarization can be performed by, for example, chemical mechanical polishing (CMP).

Advantageously, employing an asymmetric floating gate profile reduces the leakage current from the floating gate 114 to the word line 126 and allows increased erase speeds. The asymmetric floating gate profile allows the dielectric between the floating gate 114 and the word line 126 to be increased relative to the dielectric between the floating gate 114 and the erase gate 124. The increase in the dielectric between the floating gate 114 and the word line 126 reduces leakage current between the floating gate 114 and the word line 126, while at the same time allowing a thinner dielectric between the floating gate 114 and the erase gate 124 to increase erase speed. The reduction in leakage current further improves charge retention by the floating gate 114.

Thus, as can be appreciated from above, the present disclosure provides a semiconductor structure of a split gate flash memory cell. The semiconductor structure includes a semiconductor substrate with a source region and a drain region. The semiconductor structure further includes a floating gate, a word line, and an erase gate spaced over the semiconductor substrate between the source and drain regions. The floating gate is arranged between the word line and the erase gate. Even more, the semiconductor structure includes a first dielectric sidewall region disposed between the word line and the floating gate, and a second dielectric sidewall region disposed between the erase and floating gates. A thickness of the first dielectric sidewall region is greater than a thickness of the second dielectric sidewall region.

Further, the present disclosure provides a method of manufacturing a semiconductor structure of a split gate flash memory cell. A semiconductor substrate that includes a second conductive layer formed over a first conductive layer is received. The first and second conductive layers are separated from one another by a first dielectric layer. A first etch is performed through both the first dielectric layer and the second conductive layer and partially into the first conductive layer to form a pair of control gates. A second etch is performed to remove peripheral portions of the remaining first conductive layer outside a central region between the control gates, while leaving a portion of the remaining first conductive layer in the central region. A second, conformal dielectric layer is formed over sidewalls of the control gates and over the remaining first conductive layer. Portions of the conformal dielectric layer and the remaining first conductive layer in the central region are removed to form a pair of floating gates arranged under the pair of control gates, respectively.

Even more, the present disclosure provides an integrated circuit. The integrated circuit includes a semiconductor substrate. The semiconductor substrate includes a shared source/drain region and two individual source/drain regions. The shared and individual source/drain regions are spaced along a surface of the semiconductor substrate with the shared source/drain region between the two individual source/drain regions. The integrated circuit further includes two split gate flash memory cells each corresponding to one of the two individual source/drain regions. A split gate flash memory cell includes a floating gate, a word line, and an erase gate spaced over the surface between the shared source/drain region and the corresponding individual source/drain region. The floating gate is arranged between the word line and the erase gate. The split gate flash memory cell further includes a first dielectric sidewall region disposed between the floating gate and the word line, as well as a second dielectric sidewall region disposed between the floating gate and the erase gate. The first and second dielectric sidewall regions are dielectrics and asymmetric about an axis perpendicular to the surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A split gate flash memory cell comprising:
   a semiconductor substrate comprising a first source/drain region and a second source/drain region laterally spaced from the first source/drain region;
   an erase gate arranged over the first source/drain region;
   a floating gate and a word line laterally spaced over the semiconductor substrate between the first and second source/drain regions, wherein the floating gate is arranged between the word line and the erase gate, wherein the floating gate comprises an asymmetric profile about an axis at a width-wise center of the floating gate, and wherein the word line is L-shaped with a single ledge adjacent to the second source/drain region;
   a first dielectric layer arranged between the floating gate and the word line, wherein the first dielectric layer is L-shaped, spaced from the floating gate, and in contact with the word line, and wherein a bottom surface of the first dielectric layer is even with bottom surfaces respectively of the word line and the floating gate;
   a dielectric spacer arranged over and contacting the single ledge of the word line;
   a control gate arranged over the floating gate; and
   a second dielectric layer over the floating gate, and between the control and erase gates, wherein the second dielectric layer has an L-shaped profile and is spaced from the erase gate, the floating gate, and the control gate, and wherein the second dielectric layer has a single ledge extending laterally to a sidewall of the second dielectric layer that is adjacent to the erase gate and that is aligned to a sidewall of the floating gate;
   wherein a top corner of the erase gate neighbors the control gate and is even with top surfaces respectively of the first dielectric layer and the dielectric spacer, wherein a bottom corner of the floating gate neighbors the erase gate, wherein the top corner of the erase gate is laterally spaced from the bottom corner of the floating gate in a direction away from the floating gate, wherein the dielectric spacer has a rectangular profile with a planar to surface that is coplanar with planar top surfaces respectively of the first and second dielectric layers, wherein the floating gate comprises a single ledge that is adjacent to the erase gate and that is recessed below a top surface of the floating gate, and wherein a bottom surface of the second dielectric layer is vertically spaced between the single ledge of the word line and the single ledge of the floating gate.

2. The split gate flash memory cell according to claim 1, wherein a shortest distance between neighboring sidewalls of the floating and erase gates is less than a shortest distance between neighboring sidewalls of the floating gate and the word line.

3. The split gate flash memory cell according to claim 1, wherein the single ledge of the word line exhibits a reduced height relative to a top surface of the word line, wherein the top surface of the word line is coplanar with top surfaces of the control and erase gates, and wherein the single ledge of the word line and the control gate are respectively arranged on opposite sides of the word line.

4. The split gate flash memory cell according to claim 1, wherein the control gate and the floating gate have first coplanar sidewalls adjacent to the word line and second coplanar sidewalls adjacent to the erase gate, and wherein the single ledge of the floating gate extends laterally towards the erase gate from the second coplanar sidewalls.

5. The split gate flash memory cell according to claim 1, wherein the dielectric spacer comprises a first sidewall and a second sidewall respectively arranged on opposite sides of the dielectric spacer, wherein the first sidewall of the dielectric spacer is aligned with a first sidewall of the word line, and wherein the second sidewall of the dielectric spacer contacts a second sidewall of the word line.

6. The split gate flash memory cell according to claim 1, wherein the single ledge of the floating gate extends laterally towards the erase gate from a second sidewall of the floating gate to the sidewall of the floating gate, wherein the single ledge of the second dielectric layer is recessed below a top surface of the second dielectric layer, wherein the single ledge of the second dielectric layer extends laterally towards the erase gate from a second sidewall of the second dielectric layer to the sidewall of the second dielectric layer, and wherein the sidewall of the second dielectric layer is vertically aligned with the sidewall of the floating gate.

7. A split gate flash memory cell comprising:
a semiconductor substrate comprising a first source/drain region and a second source/drain region laterally spaced from the first source/drain region;
an erase gate arranged over the first source/drain region;
a floating gate and a word line laterally spaced over the semiconductor substrate between the first and second source/drain regions, wherein the floating gate is arranged between the word line and the erase gate, wherein the floating gate comprises an asymmetric profile about an axis at a width-wise center of the floating gate, and wherein the word line is L-shaped with a single ledge adjacent to the second source/drain region;
a first dielectric layer arranged between the floating gate and the word line, wherein the first dielectric layer is L-shaped, spaced from the floating gate, and in contact with the word line, and wherein a bottom surface of the first dielectric layer is even with bottom surfaces respectively of the word line and the floating gate;
a dielectric spacer arranged over and contacting the single ledge of the word line;
a control gate arranged over the floating gate; and
a second dielectric layer over the floating gate, and between the control and erase gates, wherein the second dielectric layer has an L-shaped profile and is spaced from the erase gate, the floating gate, and the control gate, and wherein the second dielectric layer has a single ledge extending laterally to a sidewall of the second dielectric layer that is adjacent to the erase gate and that is aligned to a sidewall of the floating gate;
wherein a top corner of the erase gate neighbors the control gate and is even with top surfaces respectively of the first dielectric layer and the dielectric spacer, wherein a bottom corner of the floating gate neighbors the erase gate, wherein the top corner of the erase gate is laterally spaced from the bottom corner of the floating gate in a direction away from the floating gate, wherein the dielectric spacer has a rectangular profile with a planar top surface that is coplanar with planar top surfaces respectively of the first and second dielectric layers, wherein the floating gate comprises a single ledge that is adjacent to the erase gate and that is recessed below a top surface of the floating gate, wherein a bottom surface of the second dielectric layer is vertically spaced between the single ledge of the word line and the single ledge of the floating gate, wherein the single ledge of the floating gate further extends laterally from a second sidewall of the floating gate that is vertically aligned with a sidewall of the control gate to the sidewall of the floating gate, and wherein the sidewall of the floating gate partially defines the bottom corner of the floating gate.

8. The split gate flash memory cell according to claim 7, wherein a shortest distance between neighboring sidewalls of the floating and erase gates is less than a shortest distance between neighboring sidewalls of the floating gate and the word line.

9. The split gate flash memory cell according to claim 7, wherein the single ledge of the word line exhibits a reduced height relative to a top surface of the word line, wherein the top surface of the word line is coplanar with top surfaces of the control and erase gates, and wherein the single ledge of the word line and the control gate are respectively arranged on opposite sides of the word line.

10. The split gate flash memory cell according to claim 7, wherein the control gate and the floating gate have first coplanar sidewalls adjacent to the word line and second coplanar sidewalls adjacent to the erase gate, and wherein the single ledge of the floating gate extends laterally towards the erase gate from the second coplanar sidewalls.

11. The split gate flash memory cell according to claim 7, wherein the dielectric spacer comprises a first sidewall and a second sidewall respectively arranged on opposite sides of the dielectric spacer, wherein the first sidewall of the dielectric spacer is aligned with a first sidewall of the word line, and wherein the second sidewall of the dielectric spacer contacts a second sidewall of the word line.

12. The split gate flash memory cell according to claim 7, wherein the single ledge of the floating gate extends laterally towards the erase gate from the second sidewall of the floating gate to the sidewall of the floating gate, wherein the single ledge of the second dielectric layer is recessed below a top surface of the second dielectric layer, wherein the single ledge of the second dielectric layer extends laterally towards the erase gate from a second sidewall of the second dielectric layer to the sidewall of the second dielectric layer, and wherein the sidewall of the second dielectric layer is vertically aligned with the sidewall of the floating gate.

13. A split gate flash memory cell comprising:
a semiconductor substrate comprising a first source/drain region and a second source/drain region laterally spaced from the first source/drain region;
an erase gate arranged over the first source/drain region;
a floating gate and a word line laterally spaced over the semiconductor substrate between the first and second source/drain regions, wherein the floating gate is arranged between the word line and the erase gate, wherein the floating gate comprises an asymmetric profile about an axis at a width-wise center of the floating gate, and wherein the word line is L-shaped with a single ledge adjacent to the second source/drain region;
a first dielectric layer arranged between the floating gate and the word line, wherein the first dielectric layer is L-shaped, spaced from the floating gate, and in contact with the word line, and wherein a bottom surface of the first dielectric layer is even with bottom surfaces respectively of the word line and the floating gate;
a dielectric spacer arranged over and contacting the single ledge of the word line;
a control gate arranged over the floating gate;
a second dielectric layer over the floating gate, and between the control and erase gates, wherein the second dielectric layer has an L-shaped profile and is spaced from the erase gate, the floating gate, and the control gate, and wherein the second dielectric layer has a single ledge extending laterally to a sidewall of the second dielectric layer that is adjacent to the erase gate and that is aligned to a sidewall of the floating gate;

a first dielectric region arranged between and directly abutting neighboring sidewalls of the word line and the floating gate, wherein the first dielectric region comprises the first dielectric layer; and a second dielectric region arranged between and directly abutting neighboring sidewalls of the floating gate and the erase gate, wherein a width of the second dielectric region between the single ledge of the floating gate and a base dielectric region underlying the floating gate is less than a width of the first dielectric region;

wherein a top corner of the erase gate neighbors the control gate and is even with top surfaces respectively of the first dielectric layer and the dielectric spacer, wherein a bottom corner of the floating gate neighbors the erase gate, wherein the top corner of the erase gate is laterally spaced from the bottom corner of the floating gate in a direction away from the floating gate, wherein the dielectric spacer has a rectangular profile with a planar top surface that is coplanar with planar top surfaces respectively of the first and second dielectric layers, wherein the floating gate comprises a single ledge that is adjacent to the erase gate and that is recessed below a top surface of the floating gate, and wherein a bottom surface of the second dielectric layer is vertically spaced between the single ledge of the word line and the single ledge of the floating gate.

14. The split gate flash memory cell according to claim 13, wherein the first dielectric region further comprises a third dielectric layer and a fourth dielectric layer, and wherein the third and fourth dielectric layers are respectively arranged on opposite sides of the first dielectric layer and share a common material that is different than that of the first dielectric layer.

15. The split gate flash memory cell according to claim 14, wherein a bottom surface of the third dielectric layer contacts a single ledge of the first dielectric layer, wherein opposite sidewalls of the third dielectric layer respectively contact the word line and the first dielectric layer, wherein a bottom surface of the fourth dielectric layer is even with the bottom surface of the first dielectric layer, and wherein opposite sidewalls of the fourth dielectric layer respectively contact the first dielectric layer and the control gate.

16. The split gate flash memory cell according to claim 13, wherein a shortest distance between neighboring sidewalls of the floating and erase gates is less than a shortest distance between neighboring sidewalls of the floating gate and the word line.

17. The split gate flash memory cell according to claim 13, wherein the single ledge of the word line exhibits a reduced height relative to a top surface of the word line, wherein the top surface of the word line is coplanar with top surfaces of the control and erase gates, and wherein the single ledge of the word line and the control gate are respectively arranged on opposite sides of the word line.

18. The split gate flash memory cell according to claim 13, wherein the control gate and the floating gate have first coplanar sidewalls adjacent to the word line and second coplanar sidewalls adjacent to the erase gate, and wherein the single ledge of the floating gate extends laterally towards the erase gate from the second coplanar sidewalls.

19. The split gate flash memory cell according to claim 13, wherein the dielectric spacer comprises a first sidewall and a second sidewall respectively arranged on opposite sides of the dielectric spacer, wherein the first sidewall of the dielectric spacer is aligned with a first sidewall of the word line, and wherein the second sidewall of the dielectric spacer contacts a second sidewall of the word line.

20. The split gate flash memory cell according to claim 13, wherein the single ledge of the floating gate extends laterally towards the erase gate from a second sidewall of the floating gate to the sidewall of the floating gate, wherein the single ledge of the second dielectric layer is recessed below a top surface of the second dielectric layer, wherein the single ledge of the second dielectric layer extends laterally towards the erase gate from a second sidewall of the second dielectric layer to the sidewall of the second dielectric layer, and wherein the sidewall of the second dielectric layer is vertically aligned with the sidewall of the floating gate.

* * * * *